United States Patent [19]

Swain

[11] Patent Number: 4,624,364
[45] Date of Patent: Nov. 25, 1986

[54] STOP DEVICE

[75] Inventor: Henry Swain, Basking Ridge, N.J.

[73] Assignee: Illinois Tool Works Inc., Chicago, Ill.

[21] Appl. No.: 730,516

[22] Filed: May 6, 1985

[51] Int. Cl.⁴ .............................................. B65D 73/02
[52] U.S. Cl. .................................... 206/328; 206/334;
   206/591; 267/158
[58] Field of Search ............... 206/591, 328, 817, 334;
   138/89, 94; 267/158, 164

[56] References Cited

U.S. PATENT DOCUMENTS

| | | | |
|---|---|---|---|
| 934,220 | 9/1909 | Sayles | 206/817 |
| 1,016,529 | 2/1912 | Teets et al. | 206/591 |
| 1,126,139 | 1/1915 | Walker | 206/817 |
| 2,604,315 | 7/1952 | Patterson | 206/817 |
| 2,932,546 | 4/1960 | Marggraf et al. | 206/591 |
| 2,984,399 | 5/1961 | Gaulke | 206/591 |
| 3,032,179 | 5/1962 | Menolasino et al. | 206/817 |
| 3,415,365 | 12/1968 | Faulkner | 206/585 |
| 4,295,565 | 10/1981 | Takeuchi | 206/817 |
| 4,299,850 | 11/1981 | Wallen et al. | 206/585 |
| 4,353,481 | 10/1982 | Tando | 206/328 |
| 4,533,043 | 8/1985 | Swain | 206/328 |

FOREIGN PATENT DOCUMENTS 2121764  1/1984  United Kingdom ............... 206/328

Primary Examiner—Joseph Man-Fu Moy
Attorney, Agent, or Firm—Thomas W. Buckman

[57] ABSTRACT

A stop device for electronic components housed within a tube comprises an elongate, resilient bow-shaped member having similar, oppositely extending legs defining abutment surfaces thereon for exerting a positive pressure on the electronic components and for absorbing additional pressure applied to the components during handling. A mounting structure is provided for mounting the stop device interiorly of the tube for pivotal movement relative thereto.

13 Claims, 5 Drawing Figures

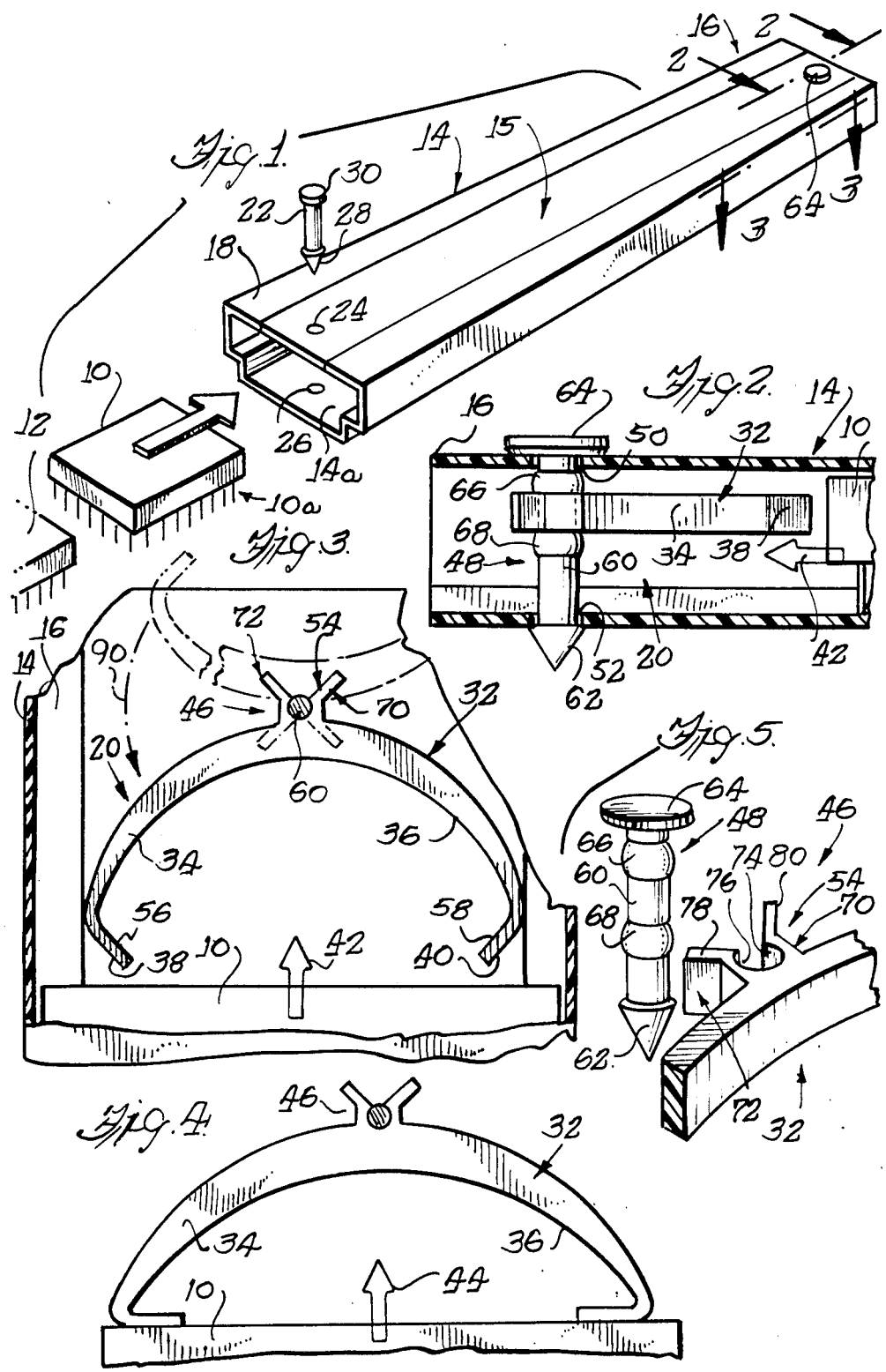

STOP DEVICE

BACKGROUND OF THE INVENTION

This invention is directed generally to a stop device, and more particularly to a resilient, preferably plastic stop device that serves as an end stop member for a tubular container, for example of the type which is used in packaging electrical or electronic components.

In the handling, transportation and storage of electronic or electrical components such as integrated circuit components and the like, it is considered advantageous to house the components in protective enclosures. One type of protective enclosure which has gained commercial acceptance comprises an elongate tubular member formed from a conductive plastic material. One wall of the tube has spaced apart edges which receive a transparent window to permit observation of the components housed within the tube. Generally speaking, the tube is of complementary cross-sectional dimensions for receiving the bodies of the electronic components in side-by-side or end-to-end abutting condition with projecting leads or terminals thereof contacting the conductive plastic material of an interior wall of the tube.

Such tubes may be formed from a continuously extruded or otherwise formed tubular member cut to desired lengths to define individual containers for packaging desired numbers of components. Accordingly, suitable end stop means must be additionally provided to close off the ends of the tubular container once the desired number of components has been loaded therein. In this regard, such end stop means have heretofore generally been spaced by some integral member of widths or lengths of the components to be packed side-by-side or end-to-end therein, so as to substantially abut outer surfaces of the component at either extreme end of the tube.

One such closure device which has been utilized consists of a generally cylindrical post or pin-like member traversing an interior dimension of the tube and preferably substantially centered within the tube. Preferably, the pin includes opposite head and tip portions of enlarged diameter for engaging opposite outer surfaces of the tube to hold the pin in place. Suitable aligned through apertures are provided at opposite ends of the tube for receiving these pins.

It will be appreciated that the foregoing end stop arrangements must of necessity leave some space or play therebetween to assure adequate space within the tube for loading the desired number of components therein. However, such additional space or play also permits some relative movement of the components within the tube during shipping and handling. Such relative movement, jostling, or the like may cause some damage to the components during handling and shipping. Moreover, the foregoing arrangement makes no provision to control or absorb any shock that the components may be subjected to during normal handling.

OBJECTS AND SUMMARY OF THE INVENTION

Accordingly, it is a general object of the invention to provide a novel and improved end stop device for electronic components housed within a tube.

A more specific object is to provide a stop device in accordance with the foregoing object which is designed to control physical shock to which the component or components may be subjected to during normal handling.

A further object is to provide a stop device in accordance with the foregoing object which serves to provide a positive pressure against the electronic components to minimize movement thereof relative to the interior of the tube and is also capable of absorbing some amount of pressure applied to the components during handling.

Briefly, and in accordance with the foregoing objects, a stop device for electronic components housed within a tube comprises an elongate, resilient bow-shaped member having similar, oppositely extending legs defining abutment surfaces thereon for exerting a positive pressure on said electronic components and for absorbing additional pressure applied to said components during handling, and mounting means for mounting said stop device interiorly of said tube for pivotal movement relative thereto.

BRIEF DESCRIPTION OF THE DRAWINGS

The features of the present invention which are believed to be novel are set forth with particularity in the appended claims. The organization and manner of operation of the invention, together with further objects and advantages thereof, may best be understood by reference to the following description taken in connection with the accompanying drawings, in which like reference numerals identify like elements, and in which:

FIG. 1 is a perspective view illustrating the loading of electronic components into a tubular carrier having one end closure in accordance with the prior art and a second end closure in accordance with the invention.

FIG. 2 is an enlarged partial perspective view taken generally in the plane of the line 2—2 of FIG. 1, and illustrating a stop device in accordance with the invention;

FIG. 3 is an enlarged partial sectional view taken generally in the plane of the line 3—3 of FIG. 1;

FIG. 4 is an enlarged view similar to FIG. 3 and illustrating further movement of an electronic component relative to the stop device of the invention; and FIG. 5 is an enlarged perspective view, partially broken away, illustrating the method of assembling the stop device of the invention.

DETAILED DESCRIPTION OF THE ILLUSTRATED EMBODIMENT

Referring now to the drawings and initially to FIG. 1, the invention provides a stop device for electronic components such as components 10 and 12 housed within an elongate tube 14. This elongate tube 14 is generally an elongate, open-ended tubular member having interior cross-sectional dimensions complementary to the dimensions of the bodies of electronic components 10, 12, which have a plurality of projecting leads or terminals 10a, 12a, in a side-by-side or end-to-end abutting condition within the tube 14. The projecting leads or terminals 10a, 12a are positioned for engagement with an inner bottom wall surface 14a of the tube 14. In this regard, the tube 14 is preferably formed from a conductive plastic material to maintain all of the terminals of the electronic devices at the same potential during shipping and handling. The tube 14 may also include a transparent window portion 15 to permit observation of the components housed therein.

In accordance with the invention, and referring also to the remaining figures, a novel stop device 20 is provided at one end 16 of the tube 14 to provide a stop surface for the electronic components 10, 12 etc. to be housed within the tube 14.

A conventional opposite end closure comprising a generally cylindrical post or pin-like member 22 may be provided for an opposite end 18 of the tube 14. In this regard, the pin member 22 preferably traverses the tube 14 and extends through opposite alinged through apertures 24, 26 formed substantially centrally in opposing walls of tube 14. The pin or post 22 additionally has enlarged tip and head portions 28, 30 for engaging opposite outer surfaces of the tube 14 about the peripheries of the through apertures 24 and 26. It should be understood that both ends 16 and 18 could be provided with the novel stop device 20. From the foregoing, it will be recognized that the length of the tube 14 is generally selected so as to house an integral number of components such as components 10 and 12. Accordingly, the effective length between closures 20 and 22 must be such as to permit an integral number of the components 10, 12, etc. to be housed therebetween. It will also be recognized that some additional space or play must be allowed between closures 20 and 22 to assure adequate space for loading the desired number of components therein. However, this additional space or play should not be such as to permit additional relative movement or jostling of the components longitudinally along the interior of the tube during shipping and handling.

To this end, and in accordance with the invention, the novel stop device or enclosure 20 will be seen to comprise an elongate, resilient, bow-shaped member 32 having similar oppositely outwardly extending legs 34, 36. These legs 34 and 36 define abutment surfaces 38, 40 thereon for engaging the end-most component 10. The resilient nature of member 32 causes it to exert a positive pressure on the electronic components within the tube, when the electronic components are advanced with respect thereto as generally indicated by arrows 42 in FIGS. 2 and 3. The resilient nature of the bow-shaped member 32 further advantageously permits further flexing or deformation thereof for absorbing any additional pressure applied to the components during handling, as indicated by arrow 44 in FIG. 4.

The stop device 20 in accordance with the invention further includes mounting means designated generally by reference numeral 46 for mounting the stop device interiorly of the tube, adjacent the end 16 thereof as previously indicated. In the illustrated embodiment, the mounting means 46 includes an elongate pin means, pin or post 48 of sufficient length dimension for traversing an interior cross-sectional dimension of the tube. In the illustrated embodiment, this pin or post 48 is similar in many respects to the previously described pin or post 22 and traverses the same dimension of tube 14, substantially centered at end 16 thereof. To this end, suitable aligned through apertures 50 and 52, similar to through apertures 24 and 26, are provided for receiving the pin or post 48. The mounting means 46 further includes a cooperative pin-engaging means or portion 54 on the elongate bow-shaped member 32 for pivotally engaging the pin means or post 48. The pin-engaging means or portion 54 will be seen to be located at a central portion of the elongate bow-shaped member 32, with the legs 34, 36 diverging generally oppositely outwardly therefrom.

Referring now more particularly to the bow-shaped member 32 and oppositely extending legs 34, 36, it will be noted that these legs have initial arcuately oppositely outwardly extending portions and terminate in inwardly converging integrally extensions 56, 58. These extensions define the abutment surfaces 38, 40 at respective outer surfaces thereof. As previously indicated, the bow-shaped member 32 and hence legs 34 and 36 and extensions 56, 58 thereof are resiliently bendable in response to advance of an electronic component relative thereto, as indicated by arrows 42 and 44. This resilient bending causes the extensions 56, 58 to bend relatively inwardly at an acute angle relative to the initial portions of legs 34 and 36, as shown in FIG. 4. It will also be noted in FIG. 4 that legs 34, 36 resiliently flex or deform somewhat laterally outwardly and compress somewhat in the direction of mounting means 46, in response to further pressure applied thereto by component 10, as indicated by arrow 44.

Upon initial loading of components 10, 12, etc. into the tube 14, the above-described resilient deformation or bending of member 32 may be sufficient to cause abutment surfaces 38 and 40 to come into substantially coplanar alignment for abutting the facing surface of electrical component 10. However, the mounting means 46 preferably positions the stop device 20 with respect to the tube 14 so as to permit yet further resilient bending or deformation thereof in response to further pressure applied to the components during handling, as indicated by arrow 44, to substantially absorb such additional pressure.

Referring now more particularly to the pin means or post 48, it will be seen to include a central, generally cylindrical shaft portion 60 and enlarged diameter leading and trailing tip and head portions 62, 64 for engaging opposite outer surfaces of the tube 14. In this regard, tip and head portions 62 and 64 are preferably substantially similar to the tip and head portions 28 and 30 previously described with respect to pin or post 22. In this regard, the tip portion 62 includes a tapered, and preferably conical lead-in surface for facilitating initial engagement thereof with, and insertion through, the through apertures 50 and 52. Thereafter the enlarged diameter portion of tip 62 engages the outer surface of the tube about the periphery of through aperture 52. In this regard, it will be appreciated that the material about apertures 50 and 52 and the material of tip portion 62 are sufficiently elastically deformable to permit such insertion. The upper or head portion 64 is preferably a substantially flat, disc-like portion for engaging the outer surface of tube 14 about the periphery of through aperture 50.

In accordance with the preferred form of the invention illustrated, the pin means or post 48 also includes a pair of spaced apart, enlarged diameter stop members 66, 68 on its shaft portion 60. These stop members are located for positioning the elongate bow-shaped member 32 in a predetermined position relative to the interior of the tube 14. As best viewed in FIG. 2, this positioning is such as to hold the bow-shaped member 32 somewhat away from either interior surface of the tube 14 so as to permit the free and unobstructed flexing thereof in response to advancement of component 10 as illustrated generally in FIGS. 2, 3 and 4.

Referring now to the pin-engaging means or portion 54 on the bow-shaped member 32, this portion will be seen to comprise a pair of resilient, spaced apart laterally outwardly extending fingers 70 and 72, substantially centered with respect to bow-shaped member 32. These fingers 70, 72 define therebetween bearing surfaces 74, 76 of complementary configuration for rotatably receiving or engaging the shaft 60 of the pin means or post 48, and preferably intermediate the enlarged diameter stop portions 66 and 68 thereof as previously indicated. In this regard, the shaft portion 60 is preferably cylindrical, whereby the bearing surfaces 74 and 76 are semi-cylindrical for receiving and engaging this shaft portion. The fingers 70 and 72 further include leading, outwardly diverging portions 78 and 80 to define lead-in surfaces to the bearing surfaces 74, 76 for facilitating snapping engagement thereof about the shaft portion 60 of the pin or post 48. In the illustrated embodiment, it will be noted that the above-described portions of the bow-shaped member 32 are all substantially symmetrically formed. That is, the legs 34, 36 and their extensions 56, 58 with abutment surfaces 38 and 40 are all substantially symmetrically formed. Similarly, the shaft-engaging fingers 70, 72, their bearing surfaces 74, 76 and the diverging lead-in portions 78 and 80 are all substantially symmetrically formed.

In the illustrated embodiment, the fingers 70 and 72 will be further seen to define substantially flat top and bottom surfaces for engagement with the stop portions 66 and 68 of the pin 48. Cooperatively, these stop portions 66 and 68 will be seen to be formed with a generally spherical curvature to facilitate rotation of the fingers relative thereto.

FIGS. 3 and 5 illustrate a method of assembly of the stop device of the invention with the tube 16. Initially, the pin member or post 48 is inserted through the aligned through apertures 50 and 52 at end 16 of tube 14. In this regard, the spherical curvature of stop portions 66 and 68 preferably define diameters no greater than the diameter of through aperture 50 and these spherical curvatures also facilitate insertion therethrough. Thereupon, the bow-shaped member 32 may be advanced with respect to the pin 48 with the pin-engaging portion 54 thereof aligned with shaft portion 60 intermediate stops 66 and 68 as generally indicated in FIG. 5. The bow-shaped member 32 may be advanced from the exterior tube 16, to engage the pin 48 as indicated in phantom line in FIG. 3. Upon snapping pivotal engagement of pin-engaging portion 54 with the pin 48, the bow-shaped member 32 may be rotated with respect to pin 48, as indicated by arrow 90 in FIG. 3, to the position indicated in solid line.

While particular embodiments of the invention have been shown and described in detail, it will be obvious to those skilled in the art that changes and modifications of the present invention, in its various aspects, may be made without departing from the invention in its broader aspects, some of which changes and modifications being matters of routine engineering or design, and others being apparent only after study. As such, the scope of the invention should not be limited by the particular embodiment and specific construction described herein but should be defined by the appended claims and equivalents thereof. Accordingly, the aim in the appended claims is to cover all such changes and modifications as fall within the true spirit and scope of the invention.

The invention is claimed as follows:

1. A stop device for electronic components housed within a tube, comprising: an elongate resilient member defining abutment surfaces thereon for exerting a positive pressure on said electronic components and for absorbing additional pressure applied to said components during handling, said elongate member being bow-shaped and defining a pair of legs extending outwardly from an apex, and mounting means for pivotally mounting said stop device, same mounting means comprises elongate pin means dimensioned for traversing one interior dimension of said tube and pin-engaging means on said elongate member for pivotally engaging said pin means.

2. A stop device according to claim 1 wherein said legs have initial, arcuately oppositely outwardly extending portions and terminate in inwardly converging integral extensions, respective outer surfaces of said extensions defining said abutment surfaces.

3. A stop device according to claim 1 wherein said pin means includes a central cylindrical shaft portion and enlarged diameter leading and trailing tip and head portions for respectively engaging opposite outer surfaces of said tube.

4. A stop device according to claim 3 wherein said tip portion includes a tapered lead-in surface for facilitating initial engagement thereof with and insertion thereof through said through apertures in said tube and thereafter facilitating engagement of said enlarged diameter portion of said tip with one said outer surface of said tube about the periphery of said through aperture therein.

5. A stop device according to claim 4 wherein said tip is conical in configuration.

6. A stop device according to claim 3 wherein said pin means further includes a pair of spaced apart enlarged diameter stop members on said shaft portion thereof for predeterminedly positioning said elongate member with respect to the interior of said tube.

7. A stop device according to claim 1 wherein said pin-engaging means on said elongate member comprises a pair of resilient spaced apart laterally outwardly extending fingers at a central portion thereof, defining therebetween bearing surfaces of complementary configuration for rotatably engaging said pin means.

8. A stop device according to claim 7 wherein said fingers include outwardly diverging portions defining lead-in surfaces for facilitating snapping engagement of said bearing surfaces about said pin means.

9. A stop device according to claim 8 wherein said fingers, said bearing surfaces and said diverging portions thereof are all substantially symmetrically formed.

10. A stop device according to claim 7 wherein said pin means includes a central cylindrical shaft portion and enlarged diameter leading and trailing tip and head portions for respectively engaging opposite outer surfaces of said tube.

11. A stop device according to claim 10 wherein said pin means further includes a pair of spaced apart enlarged diameter stop portions on said shaft portion thereof for engagement with said fingers for positioning said elongate member with respect to the interior of said tube.

12. A stop device according to claim 11 wherein said bearing surfaces define a generally cylindrical opening therebetween of a diameter similar to the diameter of said shaft portion of said pin means and wherein said fingers further define substantially flat top and bottom surfaces for engagement with said stop portions.

13. A stop device according to claim 12 wherein said stop portions have a generally spherical curvature to facilitate free rotation of said fingers relative thereto.

* * * * *